(12) United States Patent
Kariya et al.

(10) Patent No.: US 7,262,975 B2
(45) Date of Patent: Aug. 28, 2007

(54) MULTILAYER PRINTED WIRING BOARD

(75) Inventors: Takashi Kariya, Ibi-gun (JP); Toshiki Furutani, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 11/443,046

(22) Filed: May 31, 2006

(65) Prior Publication Data
US 2006/0231290 A1      Oct. 19, 2006

Related U.S. Application Data

(63) Continuation of application No. PCT/JP05/08567, filed on Apr. 28, 2005.

(30) Foreign Application Priority Data

Apr. 28, 2004   (JP)   .............................. 2004-134370

(51) Int. Cl.
*H05K 1/11*    (2006.01)
*H05K 1/14*    (2006.01)

(52) U.S. Cl. ...................... 361/795; 361/794; 361/803; 174/267

(58) Field of Classification Search ........ 361/792–795, 361/803; 174/261–268
See application file for complete search history.

(56) References Cited

U.S. PATENT DOCUMENTS

| | | | | |
|---|---|---|---|---|
| 5,509,203 A | * | 4/1996 | Yamashita | .................. 29/879 |
| 5,699,613 A | * | 12/1997 | Chong et al. | .................. 29/852 |
| 5,916,453 A | * | 6/1999 | Beilin et al. | .................. 216/38 |
| 6,384,344 B1 | * | 5/2002 | Asai et al. | .................. 174/261 |
| 6,428,942 B1 | * | 8/2002 | Jiang et al. | .................. 430/312 |
| 6,847,527 B2 | * | 1/2005 | Sylvester et al. | ........... 361/763 |
| 2006/0180341 A1 | | 8/2006 | Kariya et al. | |
| 2006/0231290 A1 | | 10/2006 | Kariya et al. | |

FOREIGN PATENT DOCUMENTS

JP   58-028848   2/1983

(Continued)

OTHER PUBLICATIONS

U.S. Appl .No. 11/415,117, filed May 2, 2006, Kariya et al.

*Primary Examiner*—Tuan T. Dinh
(74) *Attorney, Agent, or Firm*—Oblon, Spivak, McClelland, Maier & Neustadt, P.C.

(57) ABSTRACT

A multilayer printed wiring board 10 includes: a build-up layer 30 that is formed on a core substrate 20 and has a conductor pattern 32 disposed on an upper surface; a low elastic modulus layer 40 that is formed on the build-up layer 30; lands 52 that are disposed on an upper surface of the low elastic modulus layer 40 and connected via solder bumps 66 to a IC chip 70; and conductor posts 50 that pass through the low elastic modulus layer 40 and electrically connect lands 52 with conductor patterns 32. The conductor posts 50 have the aspect ratio Rasp (height/minimum diameter) of not less than 4 and the minimum diameter exceeding 30 μm, and the aspect ratio Rasp of external conductor posts 50a, which are positioned at external portions of the low elastic modulus layer 40, is greater than or equal to the aspect ratio Rasp of internal conductor posts 50b, which are positioned at internal portions of the low elastic modulus layer 40.

16 Claims, 8 Drawing Sheets

FOREIGN PATENT DOCUMENTS

| | | |
|---|---|---|
| JP | 05-047842 | 2/1993 |
| JP | 2001-036523 | 2/2001 |
| JP | 2001-298272 | 10/2001 |
| JP | 2003-077920 | 3/2003 |
| JP | 2003-133477 | 5/2003 |

\* cited by examiner

3D Strip Simulation

| Position (-th array) of IC chip | Stress (MPa) |
|---|---|
| 1 | 180 |
| 3 | 165 |
| 6 | 140 |
| 10 | 40 |
| 15 | 20 |

MULTILAYER PRINTED WIRING BOARD

BACKGROUND OF THE INVENTION

1. Field of the Invention

The present invention concerns a multilayer printed wiring board.

2. Description of the Prior Art

Electronic equipment, as represented by portable information terminals and communication terminals, are being made remarkably high in function and compactness in recent years. As a form of achieving high-density mounting of an IC chip used for such electronic equipment, onto a multilayer printed wiring board, the flip-chip method, with which the IC chip is surface-mounted directly onto the multilayer printed wiring board, is employed. As such a multilayer printed wiring board, one known multilayer printed wiring board includes a core substrate, a build-up layer formed on the core substrate, and mounting electrodes by which a IC chip is mounted via solder bumps on an upper surface of the build-up layer. The core substrate used in such a multilayer printed wiring board is prepared by molding an epoxy resin, BT (bismaleimide/triazine) resin, polyimide resin, polybutadiene resin, or phenol resin, etc. along with glass fibers or other reinforcing material. The thermal expansion coefficient of such a core substrate is approximately 12 to 20 ppm/° C. (30 to 200° C.) and is not less than approximately four times greater than the thermal expansion coefficient (approx. 3.5 ppm/° C.) of silicon of a IC chip. Thus with the above-described flip-chip method, there is the possibility that when temperature changes accompanying heat generation of the IC chip occur repeatedly, the solder bumps or the insulating layer of the semiconductor chip become broken due to the differences in the thermal expansion amounts and thermal contraction amounts of the semiconductor chip and the core substrate.

In order to resolve this problem, a multilayer printed wiring board, wherein a stress relaxing layer of low elastic modulus is disposed on the build-up layer, mounting electrodes are disposed on the upper surface of this stress relaxing layer, and a conductor pattern on the build-up layer is connected to the mounting electrodes by conductive posts, has been proposed (for example, see JP-A 58-28848 and JP-A 2001-36253).

SUMMARY OF THE INVENTION

With IC chips, wirings are being made finer and greater in the number of layers with each generation. However, as wirings are made finer, signal delays in wiring layers become dominant and interfere with attaining higher speeds. Since the delay time is proportional to the wiring resistance and inter-wiring capacitance, achievement of still higher speeds requires lowering resistance of the wiring and reduction of inter-wiring capacitance. Here, the reduction of inter-wiring capacitance is realized by lowering permittivity of interlayer insulating films. A general method of lowering permittivity is introducing air (permittivity $\epsilon$ of approximately 1) into a material with heat resistance, specifically making the material porous.

However, when heating and cooling are repeated with an IC chip that has porous interlayer insulating films and is mounted on a multilayer printed wiring board, the stress relaxing layer disclosed in the above publication cannot adequately relax the stress in some cases, resulting in forming cracks in wiring layers at external portions of the IC chip or in bumps which, among the bumps interposed between the semiconductor chip and the multilayer printed wiring board, are positioned near the external portions.

The present invention has been made to remove the above drawbacks, and an object thereof is to provide a multilayer printed wiring board, with which the breakage of external portions of an electronic element due to thermal expansion and thermal contraction is prevented and with which power can be supplied to the electronic element with stability. Another object is to provide a method of manufacturing such a multilayer printed wiring board.

In order to achieve the above objects, the present invention is constructed as follows.

A multilayer printed wiring board of the present invention includes: a core substrate; a build-up layer that is formed on the core substrate and has a conductor pattern disposed on an upper surface; a low elastic modulus layer that is formed on the build-up layer; mounting electrodes that are disposed on the upper surface of the low elastic modulus layer and connected via connecting portions to an electronic element; and conductor posts that pass through the low elastic modulus layer and electrically connect the mounting electrodes with the conductor pattern. In this multilayer printed wiring board, the conductor posts have the aspect ratio Rasp of not less than 4 and the diameter exceeding 30 μm, and the aspect ratio Rasp of external conductor posts which, among the conductor posts, are positioned at external portions of the low elastic modulus layer is greater than or equal to the aspect ratio Rasp of internal conductor posts which are positioned at internal portions of the low elastic modulus layer.

In this multilayer printed wiring board, the conductor posts have the aspect ratio Rasp of not less than 4 and the diameter exceeding 30 μm, and the aspect ratio Rasp of the external conductor posts is greater than or equal to the aspect ratio Rasp of the internal conductor posts. With this structure, the external conductor posts deform in accordance with deformations of the low elastic modulus layer while maintaining electrical connection of the mounting electrodes and the conductor pattern on the upper surface of the build-up layer. Thus, even when stress occurs due to a thermal expansion coefficient difference between the core substrate and the electronic element, the stress that is applied to external portions of the electronic element (especially an IC chip equipped with interlayer insulating films that have been made porous) and connection portions close to the external portions can be relaxed assuringly and breakage of these portions due to thermal expansion and thermal contraction can be prevented. Also, the percentage variation of the electrical resistance when heating and cooling are repeated can be restrained at a low level and power can be supplied with stability to the mounted electronic element. In the present invention, the conductor post aspect ratio Rasp refers to: conductor post height/conductor post diameter (the minimum diameter in the case where the diameter is not uniform). Also, "upper" and "upper surface" simply express relative positional relationships and may, for example, be replaced by "lower" and "lower surface."

In the multilayer printed wiring board of the invention, among the conductor posts, the aspect ratio Rasp of the external conductor posts is preferably not less than 1.25 times and not more than 2 times the aspect ratio Rasp of the internal conductor posts. This range of the aspect ratio ensures striking effects of the invention.

In the multilayer printed wiring board of the invention, it is preferable that, among the conductor posts, at least the external conductor posts are formed to have a shape with a constriction. The effects of the invention can be obtained more assuringly in comparison to the case where the conductor posts are of substantially straight shape. In the multilayer printed wiring board of the invention, the maximum diameter/minimum diameter of the external conductor posts that are formed to have a shape with a constriction is preferably not less than 2 and not more than 4.

In the multilayer printed wiring board of the invention, when the conductor posts are formed to have multiple arrays from an outermost array to an N-th array (where N is an integer of 2 or more), it is preferably that the conductor posts within a range from the outermost array to the (N×⅔)-th array are set to the external conductor posts. The stress that is applied to the conductor posts within this range is large in comparison to the stress applied to the other conductor posts. It is thus significant to apply the present invention. When N is 15, for example, the external conductor posts will be determined as conductor posts within the range from the outermost array to the tenth array, and the external conductor posts may be conductor posts in just the single outermost array, or conductor posts from the outermost array to the second array, . . . , or conductor posts from the outermost array to the tenth array.

In the multilayer printed wiring board of the invention, the low elastic modulus layer maybe formed so as to be substantially matched with the entirety of a virtual projection of the electronic element onto the low elastic modulus layer. The low elastic modulus layer may be formed beyond the entire area of this projected portion, however, since adequate effects will be provided if the low elastic modulus layer is substantially matched to the entirety of the projected portion, it is preferably formed to be substantially matched to the entirety of the projected portion in consideration of economic efficiency, etc. Also, chip capacitors and other electronic elements may be mounted on the areas in which the low elastic modulus layer is not formed. Since the distance between the chip capacitors and the IC chip will then be short, the IC chip will be less likely to become short of power if arrangements are made to supply power from the chip capacitors.

In the multilayer printed wiring board of the invention, the mounting electrodes may be top surfaces of the conductor posts that have been formed to be substantially coplanar with the upper surface of the low elastic modulus layer. This structure makes preparation simple in comparison to the structure with the mounting electrodes that are formed separately from the conductor posts.

In the multilayer printed wiring board of the invention, the Young's modulus at 30° C. of the low elastic modulus layer is preferably 10 MPa to 1 GPa. In this case, the stress due to the thermal expansion coefficient difference can be relaxed more assuringly. The Young's modulus at 30° C. of the low elastic modulus layer is more preferably 10 MPa to 300 MPa and most preferably 10 MPa to 100 MPa. Also, the conductor posts are preferably formed of material of good conductivity and are preferably formed, for example, of copper, solder, or an alloy containing either of these materials.

In the multilayer printed wiring board of the invention, the electronic element preferably includes an IC chip having interlayer insulating films that have been made porous. Since external portions of this type of electronic element break easily due to thermal expansion and thermal contraction, it is significant to apply the present invention.

DESCRIPTION OF THE PREFERRED EMBODIMENTS

Figure 1:
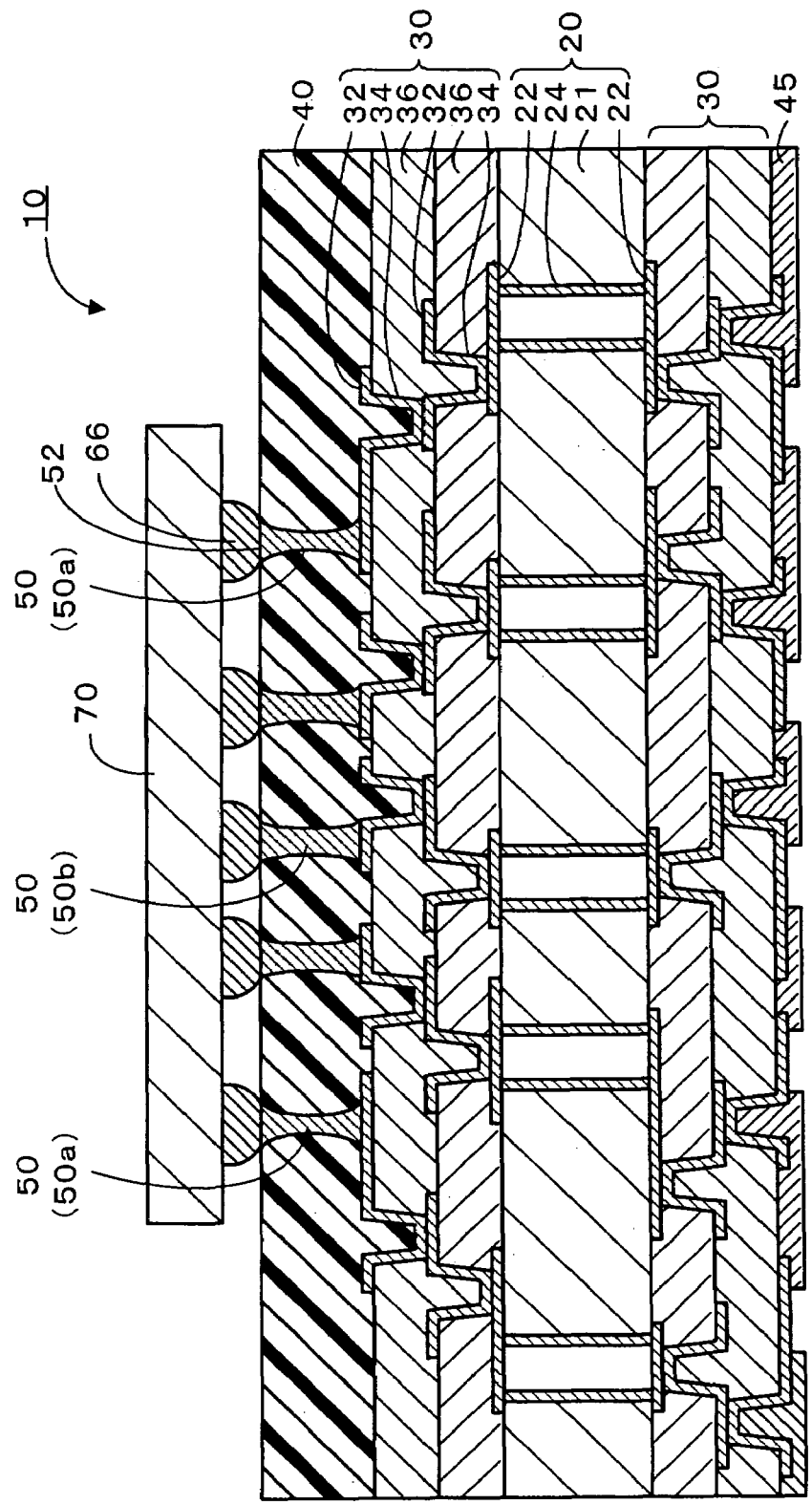
FIG. 1 is a sectional view of a multilayer printed wiring board of one embodiment.

An embodiment of the present invention shall now be described with reference to the drawings. FIG. 1 is a sectional view of a multilayer printed wiring board, which is an embodiment of this invention. Though the expressions "upper" and "lower" shall be used below, these simply express relative positional relationships for descriptive purposes and, for example, upper and lower sides may be interchanged or upper and lower sides may be replaced by left and right sides.

As shown in FIG. 1, a multilayer printed wiring board 10 of the embodiment includes: a core substrate 20, in which wiring patterns 22 formed on both the upper and lower surfaces are electrically connected with each other via through hole conductors 24; build-up layers 30, in which a plurality of conductor patterns 32 and 32 that are laminated across resin insulating layers 36 at the upper and lower sides of the core substrate 20 are electrically connected by means of via holes 34; a low elastic modulus layer 40 that is formed of a low elastic modulus material on the upper side of a build-up layer 30; lands (mounting electrodes) 52, on which a IC chip 70 as an electronic element is mounted via solder bumps 66; and conductor posts 50 that pass through the low elastic modulus layer 40 and electrically connect lands 52 with conductor patterns 32 formed on the upper surface of the build-up layer 30. Though the conductor posts 50 are formed at portions extending out from the via holes 34 in FIG. 1, the via holes 34 may be filled with a conductor material and made into filled vias and the conductor posts may be formed directly above such filled vias. In this case, the pitch between conductor posts 50 can be narrowed by making the pitch of via holes 34 narrow.

The core substrate 20 includes wiring patterns 22 that are made of copper and formed at both the upper and lower surfaces of a core substrate main body 21 formed of BT (bismaleimide-triazine) resin or a glass epoxy resin, etc., and through hole conductors 24 that are made of copper and formed on inner peripheral surfaces of through holes that pass through from the top to back of the core substrate main body 21. The wiring patterns 22 at the respective surfaces are electrically connected via the through hole conductors 24.

The build-up layers 30 are arranged by laminating resin insulating layers 36 and conductor patterns 32 alternatingly on both the upper and lower surfaces of the core substrate 20. The electrical connections of the wiring patterns 22 of the core substrate 20 and the conductor patterns 32 of the build-up layers 30 and the electrical connections of the conductor patterns 32 and 32 of the build-up layers 30 with each other are secured by means of the via holes 34, which pass through from the upper to lower sides of the resin insulating layers 36. Such build-up layers 30 are formed by any of known subtractive methods and additive methods (including semi-additive methods and full additive methods). Following is an example of specific method of forming the build-up layers 30. First, resin sheets that are to become resin insulating layers 36 are adhered onto both the upper and lower surfaces of the core substrate 20. Each of these resin sheets is formed of a modified epoxy based resin sheet, a polyphenylene ether based resin sheet, a polyimide based resin sheet, or a cyanoester based resin sheet, etc., and the thickness thereof is approximately 20 to 80 μm. Through holes are then formed in the adhered resin sheets by means of a carbon dioxide gas laser, UV laser, YAG laser, excimer laser, etc., and the resin sheets are thereby made into resin insulating layers 36. Electroless copper plating is then applied, exposure and development are carried out upon forming resists on the electroless copper plating layers. After applying electrolytic copper plating on portions at which the resists are not formed, the resists are removed, and the electroless copper plating at portions at which the resists had existed is etched using a sulfuric acid—hydrogen peroxide based etching solution, thus forming wiring patterns 32. The conductive layers at the interiors of the through holes become via holes 34. This procedure is then repeated to form build-up layers 30. A solder resist layer 45 is formed on the back surface.

The low elastic modulus layer 40 is formed of an elastic material with a Young's modulus at 30° C. of 10 to 1000 MPa (preferably 10 to 300 MPa and more preferably 10 to 100 MPa). Even when stress occurs between the IC chip 70, which is electrically connected to lands 52 via solder bumps 66, and the core substrate 20 due to the thermal expansion coefficient difference occurs between the two components, the Young's modulus of the low elastic modulus layer 40 is within the above range can adequately relax the stress. Examples of the elastic material used for the low elastic modulus layer 40 include resins that has a Young's modulus in the above range and is, for example, resin in which a rubber-based component, such as polybutadiene, silicone rubber, urethane, SBR, or NBR, or an inorganic component, such as silica, alumina, or zirconia, is dispersed in a thermosetting resin, such as epoxy resin, imide based resin, phenol resin, or silicone resin, or a thermoplastic resin, such as a polyolefin based resin, vinyl based resin, or an imide based resin. One type or two or more types of the components may be dispersed in the resin, and both rubber components and inorganic components may be dispersed. In the present embodiment, a resin, with which 60 vol % of an urethane resin is dispersed in an epoxy resin, is used as the elastic material of the low elastic modulus layer 40.

Figure 2:
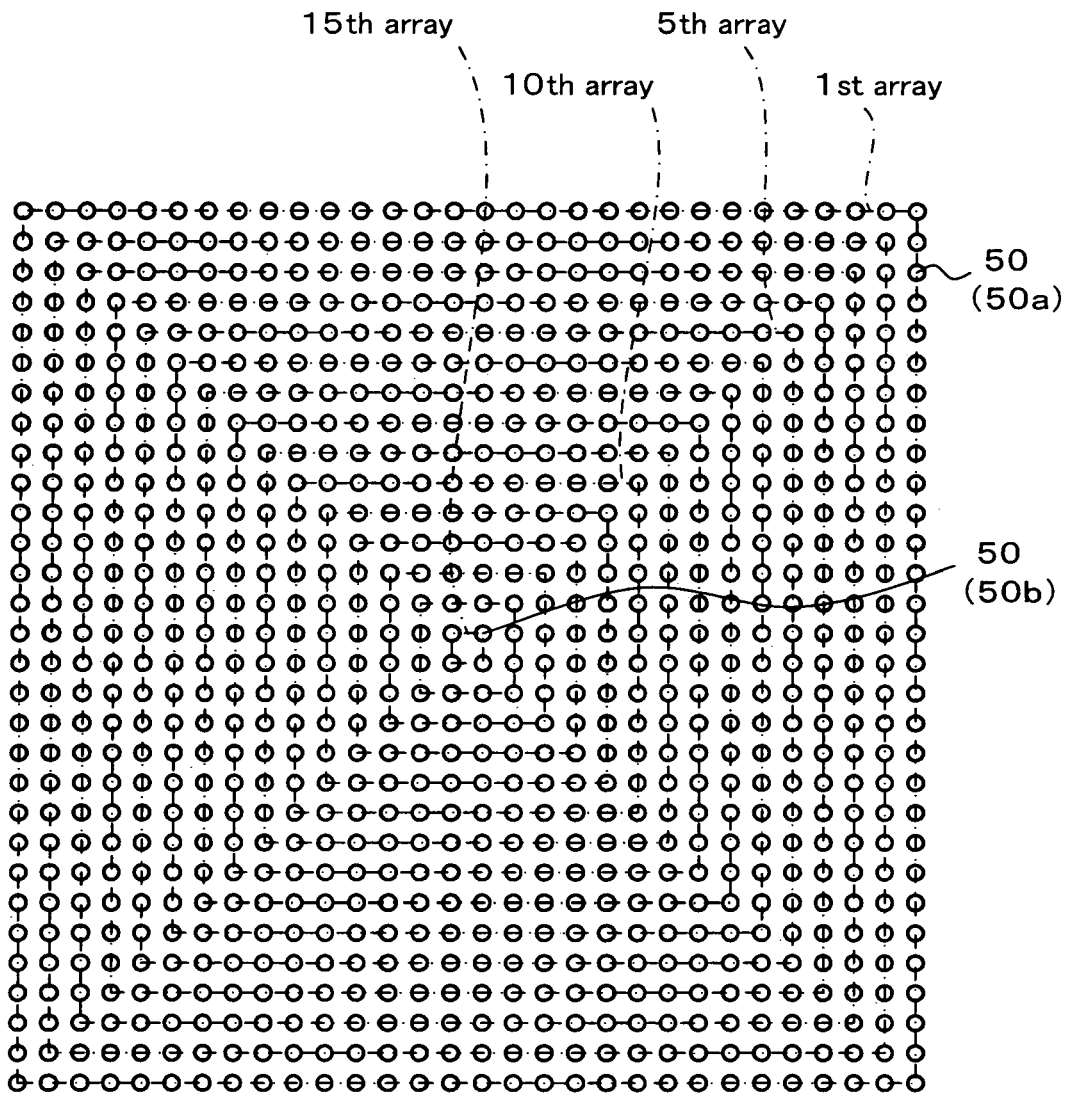
FIG. 2 is a layout diagram of conductor posts of the embodiment.
Figure 3:
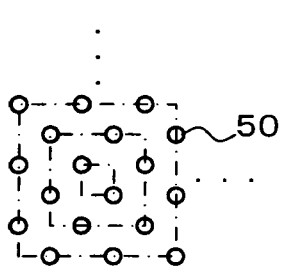
FIG. 3 is a layout diagram of other conductor posts.

The conductor posts 50 are formed of copper as the main component and so as to pass through the low elastic modulus layer 40 in the vertical direction and electrically connect lands 52 with a conductor pattern 32 disposed on the upper surface of the build-up layer 30. The conductor posts 50 are formed to have a shape with a constriction or specifically, a shape with which the diameter of an intermediate portion is smaller than the diameter of an upper portion and the diameter of a lower portion. In this embodiment, among the conductor posts 50, those that are positioned at external portions of the low elastic modulus layer 40 shall be referred to as external conductor posts 50a and those positioned in internal portions shall be referred to as internal conductor posts 50b. Though only a few conductor posts 50 are shown in FIG. 1 for the sake of convenience, in actuality multiple arrays of the conductor posts are formed as shown for example in the layout diagram of conductor posts 50 of FIG. 2. Here, the multiple arrays include fifteen arrays of from an outermost array to a fifteenth array, where the conductor posts from the outermost array to the tenth array (that is two-third of the fifteen arrays) are defined as external conductor posts 50a while the remaining conductor posts are defined as internal conductor posts 50b. With both the external conductor posts 50a and the internal conductor posts 50b, the aspect ratio Rasp, that is, the ratio of the height with respect to the diameter of an intermediate portion (minimum diameter) is not less than 4, and the minimum diameter exceeds 30 μm. The aspect ratio Rasp of the external conductor posts 50a is set to be greater than or equal to the aspect ratio Rasp of the internal conductor posts 50b, and specifically, the aspect ratio Rasp of the external conductor posts 50b is designed to be not less than 1.25 times and not more than 2 times the aspect ratio Rasp of the internal conductor posts 50a. The external conductor posts 50a are formed so that the maximum diameter/minimum diameter is not less than 2 and not more than 4. Though the conductor posts 50 are positioned in a lattice-like manner as one example in FIG. 2, the conductor posts may instead be positioned in a zigzag manner as shown in FIG. 3, or in a random manner as long as arrays can be counted from the external periphery.

The lands 52 are the top surfaces of the respective conductor posts 50 that are exposed from the low elastic modulus layer 40. The lands 52 are subject to nickel plating and subsequently to gold plating, and are connected to electrode portions of the IC chip 70 via the solder bumps 66. As the IC chip 70, the present embodiment uses an IC chip, which employs interlayer insulating films that have been made porous and have air (permittivity ε of approximately 1) introduced therein to reduce the inter-wiring capacitance and thereby enable high speed, that is, high frequency drive.

Figure 4:
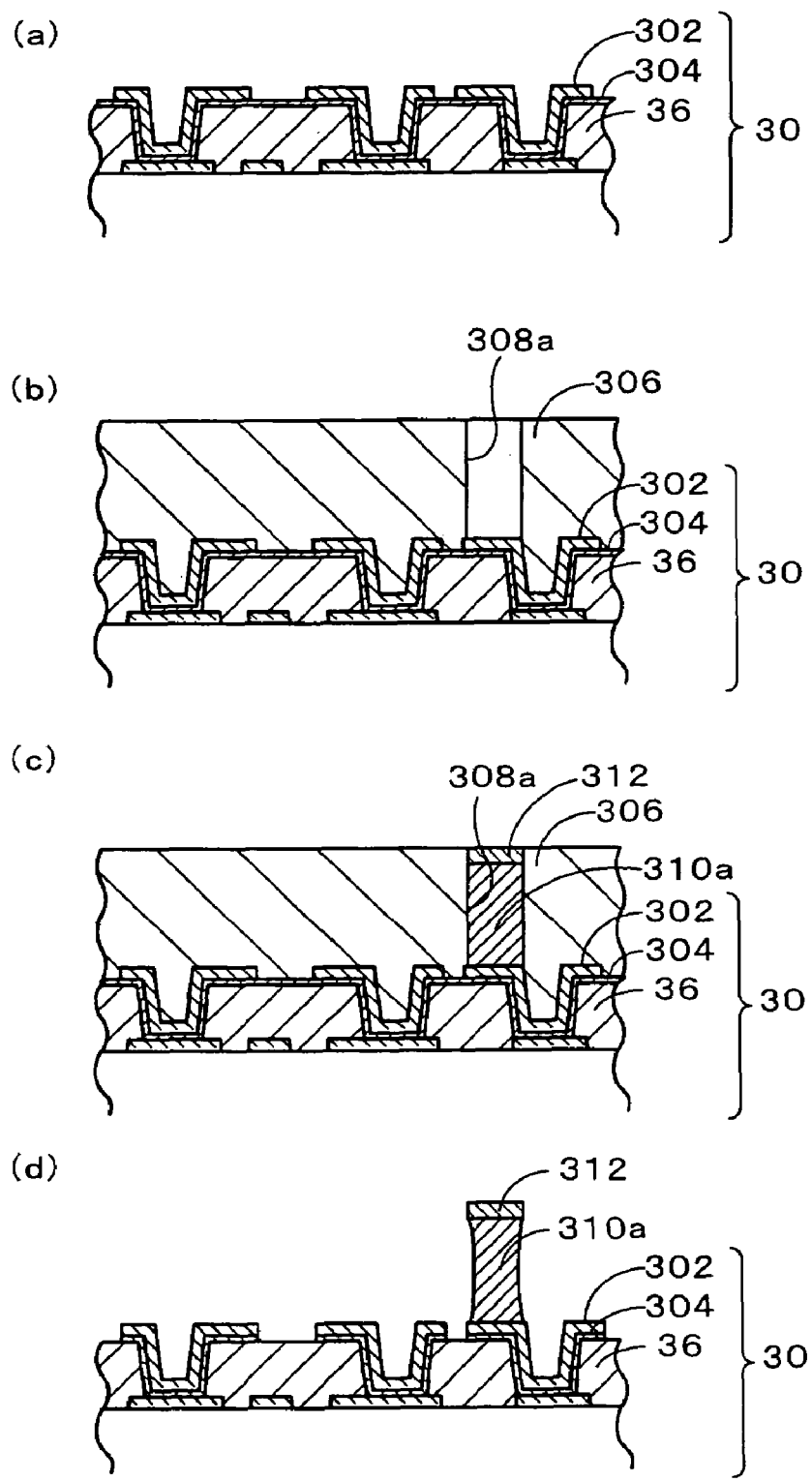
FIG. 4 shows explanatory diagrams of preparation procedures of the multilayer printed wiring board of the embodiment.
Figure 5:
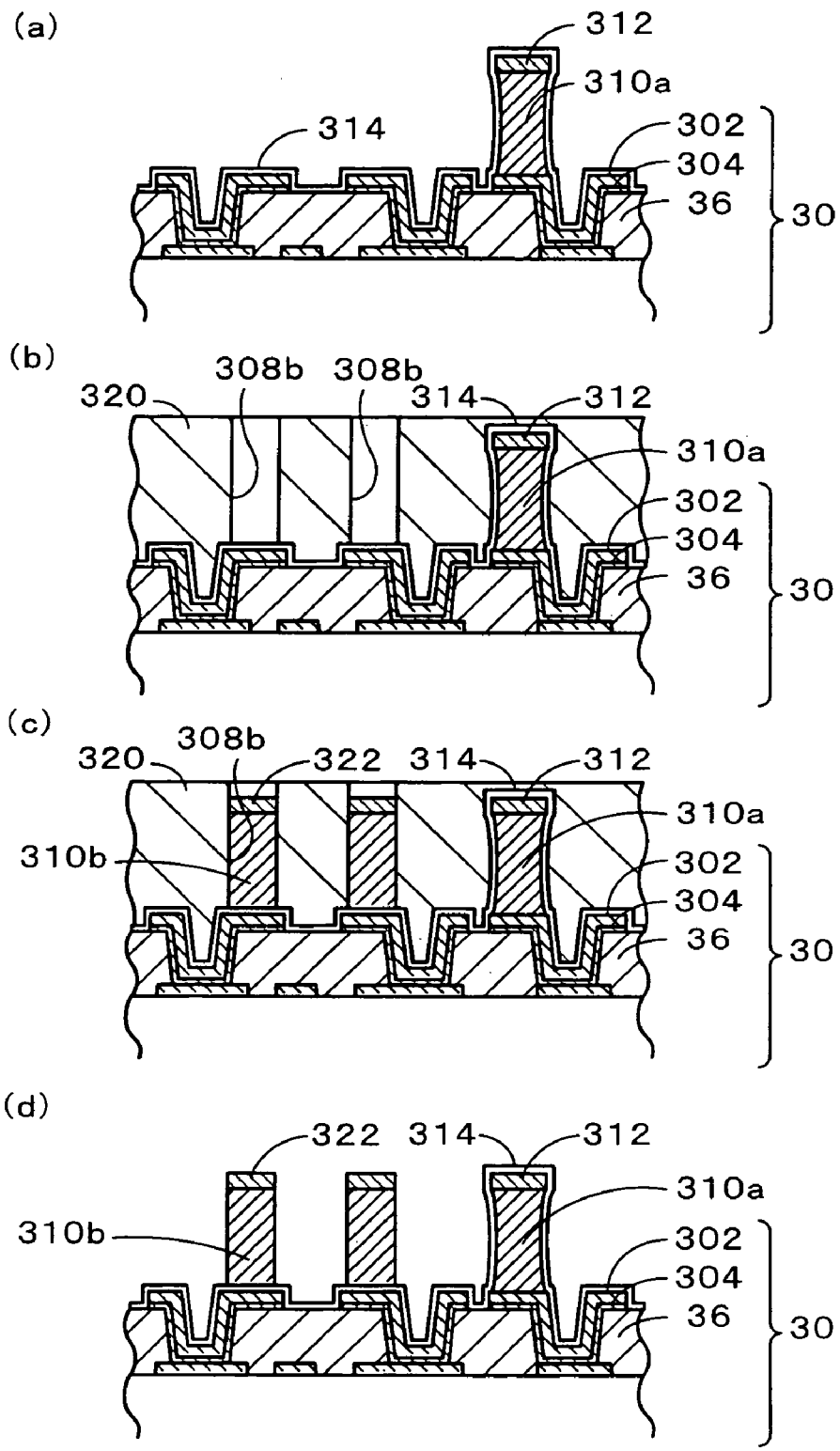
FIG. 5 shows explanatory diagrams of preparation procedures of the multilayer printed wiring board of the embodiment.
Figure 6:
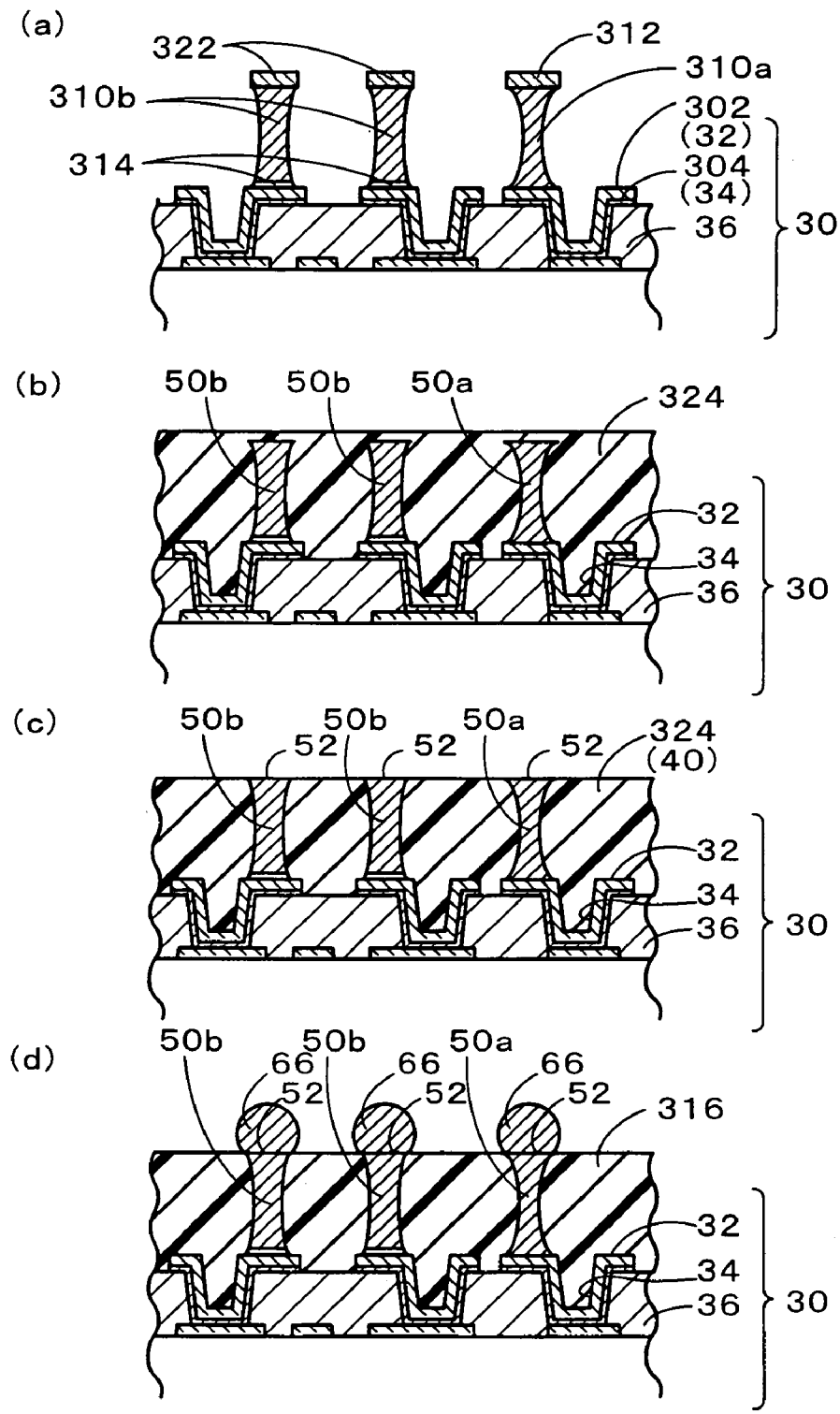
FIG. 6 shows explanatory diagrams of preparation procedures of the multilayer printed wiring board of the embodiment.

An example of manufacturing the multilayer printed wiring board 10 shall now be described. Since the procedures for preparing the core substrate 20 and build-up layer 30 are well known, the description here shall mainly concern the procedures for preparing the low elastic modulus layer 40, conductor posts 50, and lands 52. FIGS. 4 to 6 are explanatory diagrams of the procedures. In FIGS. 4 to 6, a partial sectional view of a build-up layer 30 formed on the upper surface of core substrate 20 is shown in order to give the explanation of the procedures.

First, the core substrate 20, on which build-up layer 30 is formed, was prepared (see FIG. 4A). At this stage, the top surface of the upper most resin insulating layer 36 is still covered with an electroless copper plating layer 304. That is, this is the stage where electroless copper plating had been applied to the resin insulating layer 36 with through holes formed therein so as to form electroless copper plating layer 304, a photoresist had been formed and subject to patterning on the electroless copper plating layer 304, and subsequently electrolytic copper plating had been applied to portions at which the photoresist had not been formed, and after that the photoresist had been peeled off. Thus, whereas the electrolytic copper plating layer has been patterned and made into a patterned plating layer 302, electroless copper plating layer 304 is left to cover the entire surface of resin insulating layer 36. A commercially available dry film 306 (formed by overlapping two sheets of CX-A240, made by Asahi Kasei Corpporation.; total thickness: 240 μm) was then adhered onto the upper surface of such a build-up layer 30, and holes 308a of large diameter were formed at external portions of the substrate by a carbon dioxide gas laser (see FIG. 4B). These holes 308a reach the patterned plating layer 302.

Then with this substrate in the middle of preparation, electrolytic copper plating was performed from bottom portions of holes 308a of the dry film 306 to fill the interiors of holes 308a with columnar copper layers 310a, and solder layers 312 were furthermore formed on the upper surfaces of copper layers 310a (see FIG. 4C). The composition of the electrolytic copper plating solution used was: 2.24 mol/l of sulfuric acid, 0.26 mol/l of copper sulfate, and 19.5 ml/l of an additive (Cupracid GL, made by ATOTECH Japan Co., Ltd.). The electrolytic copper plating was carried out under the conditions of a current density of 1 A/dm2, a duration of 17 hours, and a temperature of 22±2° C. Sn/Pb was used for solder layers 312.

After peeling off the dry film 306, the substrate in the middle of preparation was subject to etching by immersion in an ammonia alkali etching solution (trade name: A-Process, made by Meltex Inc.). By this etching, the electroless copper plating layer 304 was removed with respect to portions that had not been covered with the electrolytic copper plating layer 302, and the intermediate portions of columnar copper layers 310a were formed to have a shape with a constriction (see FIG. 4D). Here, the solder layers 312 functioned as etching resists. The degree to which the intermediate portions of copper layers 310a are etched can be varied by controlling etching time.

An electroless copper plating layer 314 was then formed by applying electroless copper plating to the entire surface of the substrate in the middle of preparation (see FIG. 5A). The thickness of this electroless copper plating layer 314 is several μm. Then by using Alpha Coater (trade name; made by Cermatronics Boeki Co., Ltd.), a commercially available liquid resist agent was coated in a non-contacting state so as to cover the entire surface and then dried and made into a resin layer 320, and holes 308b of small diameter were formed at internal portions of the substrate by means of a carbon dioxide gas laser (see FIG. 5B). Here, the holes 308a, which were formed priorly, were made to have a diameter of 120 μm and the holes 308b, which were formed at this stage, were made to have a diameter of 100 μm. Then with this substrate in the middle of preparation, electrolytic copper plating was performed from bottom portions of the holes 308b of the resin layer 308 to fill the interiors of holes 308b with columnar copper layers 310b, solder layers 322 were furthermore formed on the upper surfaces of the copper layers 310b (see FIG. 5C), and thereafter the resin layer 320 was peeled off (see FIG. 5D). The composition of the electrolytic copper plating solution used was: 2.24 mol/l of sulfuric acid, 0.26 mol/l of copper sulfate, and 19.5 ml/l of an additive (Cupracid GL, made by ATOTECH Japan Co., Ltd.). The electrolytic copper plating was carried out under the conditions of a current density of 1 A/dm2, a duration of 17 hours, and a temperature of 22±2° C. Sn/Pb was used for the solder layers 322.

The substrate in the middle of preparation was then etched by immersion in an ammonia alkali etching solution (trade name: A-Process, made by Meltex Inc.). By this etching, portions of the electroless copper plating layer 314 that had been exposed on the surface were removed, the intermediate portions of columnar copper layers 310b were formed to have a shape with a constriction, and the intermediate portions of copper layers 310a, which had been formed already to a shape with a constriction, were etched further and made smaller in minimum diameter (see FIG. 6A). Also, since fresh etching solution was sprayed from the periphery of the substrate during this etching process, the copper layers 310a, which had been erected at the external portions of the substrate, were etched more at the intermediate portions in comparison to the copper layers 310b, which had been erected at the internal portions. At this stage, of the electrolytic copper plating layer 302 and the electroless copper plating layer 304, the portions on the upper surface of the resin insulating layer 36 became the conductor pattern 32, and the through hole portions became via holes 34. Here, the solder layers 312 and 322 functioned as etching resists. The degree to which the intermediate portions of copper layers 310A are etched can be varied by controlling etching time. Thereafter, solder resist layer 45 with openings was formed on the back surface.

The solder layers 312 and 322 were removed by immersing the substrate in the middle of preparation in a solder stripping agent (trade name: Enstrip TL-106, made by Meltex Inc.), and after that a resin film, with which 60 vol % of urethane resin is dispersed in an epoxy resin, was adhered (see FIG. 6B) and cured at 150° C. for 60 minutes to be made into the resin layer 324. As a result, the copper layers 310a became external conductor posts 50a and the electroless copper plating layer 314 and the copper layers 310b became internal conductor posts 50b. Thereafter the resin layer 324 was polished until the top surfaces of the external conductor posts 50a and internal conductor posts 50b became exposed (see FIG. 6C). After the polishing, the resin layer 324 becomes the low elastic modulus layer 40. The top surfaces of conductor posts 50a and 50b that were exposed from the low elastic modulus layer 40 become lands 52.

The substrate in the middle of preparation was then immersed in an acidic solution containing a palladium catalyst that activates the copper surface and was thereafter immersed for 20 minutes in an electroless nickel plating solution of pH 5, comprising 30 g/l of nickel chloride, 10 g/l of sodium hypophosphite, and 10 g/l of sodium citrate, to form a nickel plating layer of 5 μm thickness on lands 52. The substrate was furthermore immersed for 23 seconds under the condition of 93° C. in an electroless gold plating solution, comprising 2 g/l of gold potassium cyanide, 75 g/l of ammonium chloride, 50 g/l of sodium citrate, and 10 g/l of sodium hypophosphite, to form a gold plating layer of 0.03 μm thickness on top of the nickel plating layer. Finally, printing is performed on a solder paste using a mask pattern and performing reflow at 230° C., so as to form solder bumps 66 on the lands 52. The preparation of the multilayer printed wiring board 10 was thereby completed (see FIGS. 6D and 1).

In the multilayer printed wiring board 10 of the embodiment described above, both of the external conductor posts 50a and the internal conductor posts 50b have the aspect ratio Rasp of not less than 4 and the diameter of exceeding 30 μm, and the aspect ratio Rasp of the external conductor posts 50a is greater than or equal to the aspect ratio Rasp of the internal conductor posts 50b. The external conductor posts 50a deform in accordance with deformations of the low elastic modulus layer 40 while maintaining electrical connection of the lands 52 with the conductor pattern 32 on the upper surface of the build-up layer. Thus, even if stress occurs due to the thermal expansion coefficient difference of the core substrate 20 and the semiconductor chip 70, the stress that is applied to external portions of the IC chip 70 and solder bumps 66 near the external periphery can be relaxed assuringly and breakage of these portions due to thermal expansion and thermal contraction can be prevented. Also, the percentage variation of the electrical resistance upon repeated heating and cooling can be restrained so as to ensure stable supply of power to the mounted IC chip 70. In particular, since the conductor posts 50 have a diameter exceeding 30 μm, the conductor posts 50 are made low in electrical resistance, and even if the IC chip 70 with an operating clock of not less than 3 GHz is mounted, the transistors of the IC chip 70 will not become short of power. These effects have been proven with Examples as shall be described later.

In the above embodiment, the aspect ratio Rasp of the external conductor posts 50*a* is not less than 1.25 times and not more than 2 times the aspect ratio Rasp of the internal conductor posts 50*b*, and the above-described effects are made striking. The external conductor posts 50*a* and internal conductor posts 50*b* are formed to have shapes with constrictions, therefore the percentage variation of the electrical resistance upon repeated heating and cooling can be restrained further in comparison to conductor posts of substantially straight shapes. In the above embodiment, among the conductor posts 50, conductor posts from the outermost array to the tenth array (that is, up to tow-third of the entirety (fifteen arrays)) are arranged as the external conductor posts 50*a*. Since the stress applied to conductor posts 50 in this range is large in comparison to the stress applied to the other conductor posts 50, the significance of applying this invention is high. In the above embodiment, the top surfaces of conductor posts 50 formed to be coplanar with the upper surface of the low elastic modulus layer 40 and are used as the lands 52. Preparation of the multilayer printed wiring board with such a structure is simple in comparison to a case where lands are formed separately from the conductor posts 50. In addition, since the low elastic modulus layer 40 in the above embodiment has the Young's modulus at 30° C. of 10 MPa to 1 GPa, stress due to the thermal expansion coefficient difference can be relaxed more assuringly.

The present invention is by no means restricted to the above-described embodiment and can obviously be put into practice by various modes within the scope of the art of the invention.

In the above embodiment, the conductor posts 50 (50*a* and 50*b*) were made to have shapes with constrictions. The shapes may otherwise be made substantially straight columnar shapes, or just external conductor posts 50*a* may be made to have a shape with a constriction, or just internal conductor posts 50*b* may be made to have a shape with a constriction. The relevant effects of the invention can be obtained in all cases, as long as the external conductor posts 50*a* and internal conductor posts 50*b* are prepared to have the aspect ratio of not less than 4 and the diameter exceeding 30 μm and the aspect ratio Rasp of external conductor posts 50*a* is greater than or equal to the aspect ratio Rasp of internal conductor posts 50*b*. This has also been proven with the Examples as shall be described later.

Figure 7:
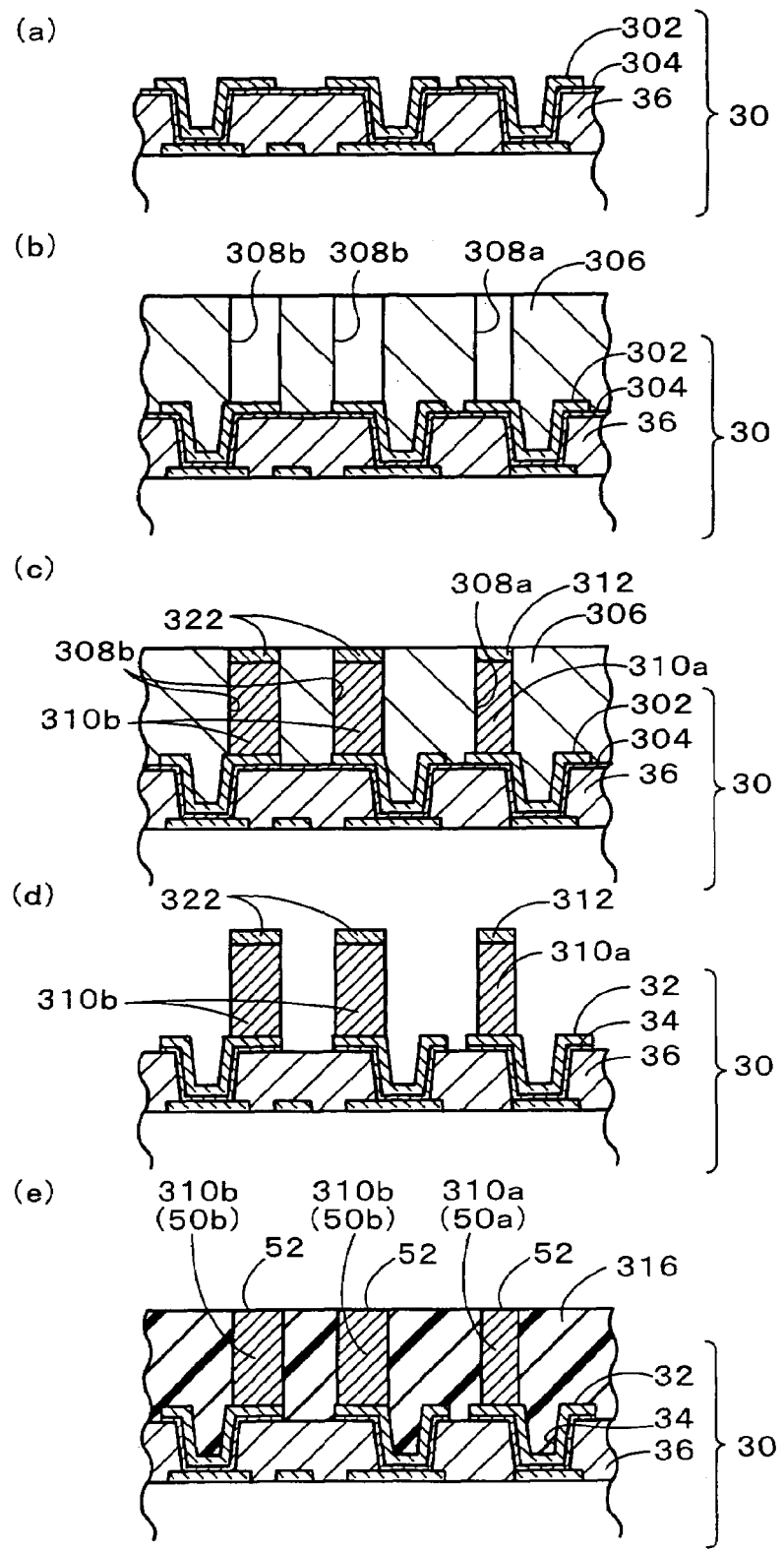
FIG. 7 shows sectional views of other preparation procedures of the multilayer printed wiring board of the embodiment.

FIG. 7 shows explanatory diagrams of an example of preparation procedures for a multilayer printed wiring board that includes conductor posts 50*a* and 50*b* formed to have substantially straight shapes. Similarly to the above embodiment, the core substrate 20, on which the build-up layer 30 is formed, was prepared (see FIG. 7A). A commercially available dry film 306 (formed by overlapping two sheets of CX-A240, made by Asahi Kasei Corporation.; total thickness: 240 μm) was then adhered onto the upper surface of the build-up layer 30 and holes 308*a* of small diameter (for example, 33 μm) were formed at external portions of the substrate and holes 308*b* of large diameter (for example, 50 μm) were formed at internal portions of the substrate by a carbon dioxide gas laser (see FIG. 7B). Then with this substrate in the middle of preparation, electrolytic copper plating was performed from bottom portions of the respective holes 308*a* and 308*b* to fill the interiors of holes 308*a* and 308*b* with columnar copper layers 310*a* and 310*b*, and solder layers 312 and 322 were furthermore formed on the upper surfaces of copper layers 310*a* and 310*b* (see FIG. 7C). Then after peeling off the dry film 306, the substrate in the middle of preparation was subject to etching by immersion in an ammonia alkali etching solution, and portions of the electroless copper plating layer 304 that were exposed on the surface were thereby removed (se FIG. 7D). Here, the solder layers 312 and 322 functioned as etching resists. The copper layers 310*a* and 310*b* were formed to have substantially straight shapes by controlling the etching time. In order to form substantially straight shapes, the use of a slit nozzle that enables spraying of an etching solution in the form of a straight line is effective. Of the electrolytic copper plating layer 302 and the electroless copper plating layer 304, the upper surface portions of the resin insulating layer 36 became the conductor pattern 32 and the through hole portions became via holes 34. Subsequently, the solder layers 312 and 322 were removed by a solder stripping agent, a resin film, with which 60 vol % of urethane resin is dispersed in an epoxy resin, was adhered onto the substrate in the middle of preparation and cured at 150° C. for 60 minutes to be made into the resin layer 316, and thereafter the resin layer 316 was polished until the surfaces of copper layers 310*a* and 310*b* became exposed (see FIG. 7E). As a result, the copper layers 310*a* became external conductor posts 50*a*, the copper layers 310*b* became internal conductor posts 50*b*, and the resin layer became the low elastic modulus layer 40. The top surfaces of conductor posts 50*a* and 50*b* that were exposed from the low elastic modulus layer 40 became lands 52. Solder bumps can be thereafter formed on lands 52 in the same manner as in the above embodiment. The multilayer printed wiring board thus obtained exhibits substantially the same effects as the embodiment described above.

In one modified structure, a solder resist layer may be formed on the low elastic modulus layer 40 of the above embodiment. In this case, openings are provided in the solder resist layer so that lands 52 will be exposed to the exterior. Such a solder resist layer may be formed by a normally used method.

In the above embodiment, just a single low elastic modulus layer 40, equipped with the conductor posts 50, is formed on the build-up layer 30. In one modified structure, a plurality of layers may be laminated.

In the above embodiment, the top surfaces of conductor posts 50, that is, portions of conductor posts 50 were made lands 52. In one modified structure, the lands may be formed from separate entities from conductor posts 50, on the top surfaces of conductor posts 50.

Figure 8:
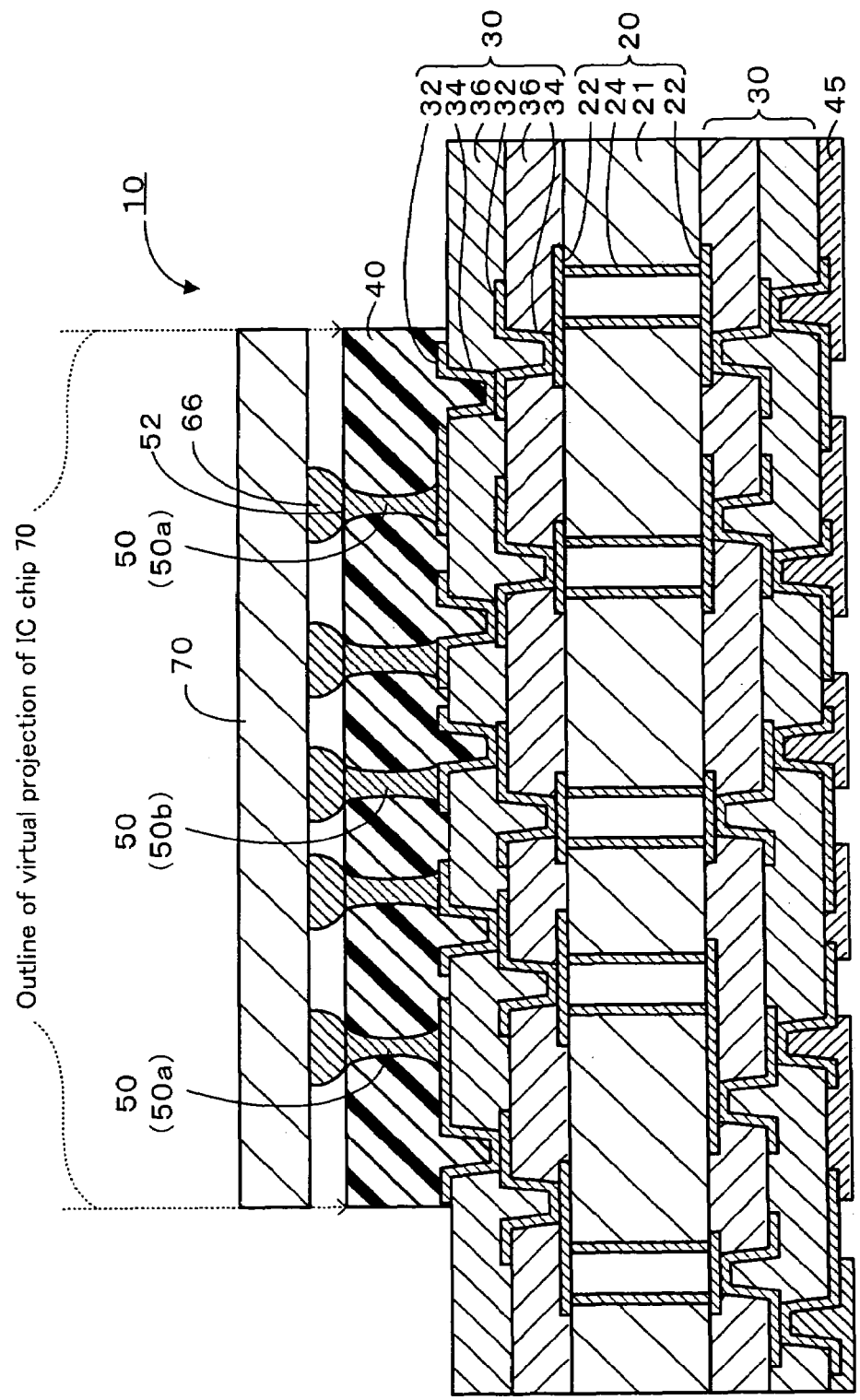
FIG. 8 is a sectional view of another multilayer printed wiring board.

In another modified structure, as shown in FIG. 8, the low elastic modulus layer 40 may be formed to substantially match the entirety of a projected portion resulting from the virtual projection of the IC chip 70 onto the low elastic modulus layer 40. The low elastic modulus layer 40 may be formed beyond the projected portion and on the entire surface of the build-up layer 30 as in FIG. 1. Since adequate effects are exhibited as long as the low elastic modulus layer 40 is formed to substantially match the entirety of the projected portion, it may be formed to substantially match the entirety of the projected portion in consideration of economic efficiency, etc.

EXAMPLES

Examples for verifying the effects of the multilayer printed wiring board 10 of the embodiment shall now be described. First, the relationship between the aspect ratio Rasp of the conductor posts and the percentage variation of the electrical resistance after repeating heating and cooling shall be described. Multilayer printed wiring boards having conductor posts (30 by 30 square conductor posts are arranged in lattice-like manner, forming multiple arrays from an outermost array to a fifteenth array) of Examples 1 to 23, shown in Table 1, were prepared in accordance with the above embodiment. In Table 1, the multilayer printed wiring boards of Examples 1 to 12 have conductor posts, with which the minimum diameter and the maximum diameter are the same, that is, conductor posts having a substantially straight, columnar shape, and these examples were prepared in accordance with the preparation procedures shown in FIG. 7. The multilayer printed wiring boards of Examples 13 to 23 have conductor posts, with which the minimum diameter and the maximum diameter differ, that is, conductor posts having a shape with a constriction, and these examples were prepared in accordance with the preparation procedures shown in FIGS. 4 to 6. An IC chip which has an interlayer insulating film that was made porous was mounted on each example of the multilayer printed wiring board, and the interval between the IC chip and the multilayer printed wiring board was filled with a sealing resin to prepare an IC mounted board. The electrical resistance of a specific circuit passing through the IC chip (the electrical resistance across a pair of electrodes, which are exposed on the surface at the side opposite the IC chip mounting surface of the IC mounted board and are continuous with the IC chip) was measured and the measured value was used as an initial value. The IC mounted boards were then subject to a heat cycle test in which a cycle of −55° C.×5 minutes and 125° C.×5 minutes was repeated 2000 times. In the heat cycle test, the electrical resistance was measured at the 250th, 500th, 750th, 1000th, 1250th, 1500th, 2000th, and 2500th cycle and the percentages of variation with respect to the initial value (100×(measured value−initial value)/initial value (%)) were determined. The results are shown in Table. 1. In Table 1, cases wherein the percentage variation of the electrical resistance was within ±5% are indicated as being "excellent" (double circle), cases wherein the percentage variation was ±5 to 10% are indicated as being "good" (○), and cases wherein the percentage variation exceeded ±10% are indicated as being "poor" (×). Here, whereas a smaller percentage variation of the electrical resistance means that there is little damaging of external portions of the IC chip and solder bumps close to the external portions and power can be supplied with stability to the IC chip, a large percentage variation of the electrical resistance means that there is much damaging of the external portions of the IC chip and solder bumps close to the external portions of the IC chip and power cannot be supplied stably to the IC chip. The target specification was set to a percentage variation of within ±10% (that is an "excellent" or "good" evaluation) at the 1000th cycle.

TABLE 1

| | | Shape of external conductor post | | | | Shape of internal conductor post | | | |
|---|---|---|---|---|---|---|---|---|---|
| Examples | Array No. | Height μm | Minimum diameter μm | Maximum diameter μm | External Rasp | Height μm | Minimum diameter μm | Maximum diameter μm | Internal Rasp |
| 1 | ~1 | 200 | 60 | 60 | 3.3 | 200 | 50 | 50 | 4 |
| 2 | ~1 | 200 | 50 | 50 | 4 | 200 | 50 | 50 | 4 |
| 3 | ~1 | 200 | 40 | 40 | 5 | 200 | 50 | 50 | 4 |
| 4 | ~1 | 200 | 33 | 33 | 6.1 | 200 | 50 | 50 | 4 |
| 5 | ~10 | 200 | 60 | 60 | 3.3 | 200 | 50 | 50 | 4 |
| 6 | ~10 | 200 | 50 | 50 | 4 | 200 | 50 | 50 | 4 |
| 7 | ~10 | 200 | 40 | 40 | 5 | 200 | 50 | 50 | 4 |
| 8 | ~10 | 200 | 33 | 33 | 6.1 | 200 | 50 | 50 | 4 |
| 9 | ~3 | 200 | 40 | 40 | 5 | 200 | 50 | 50 | 4 |
| 10 | ~6 | 200 | 40 | 40 | 5 | 200 | 50 | 50 | 4 |
| 11 | ~1 | 200 | 50 | 50 | 4 | 200 | 60 | 60 | 3.3 |
| 12 | ~10 | 200 | 50 | 50 | 4 | 200 | 60 | 60 | 3.3 |
| 13 | ~1 | 200 | 60 | 120 | 3.3 | 200 | 50 | 100 | 4 |
| 14 | ~1 | 200 | 50 | 120 | 4 | 200 | 50 | 100 | 4 |
| 15 | ~1 | 200 | 40 | 120 | 5 | 200 | 50 | 100 | 4 |
| 16 | ~1 | 200 | 33 | 120 | 6.1 | 200 | 50 | 100 | 4 |
| 17 | ~10 | 200 | 60 | 120 | 3.3 | 200 | 50 | 100 | 4 |
| 18 | ~10 | 200 | 50 | 120 | 4 | 200 | 50 | 100 | 4 |
| 19 | ~10 | 200 | 40 | 120 | 5 | 200 | 50 | 100 | 4 |
| 20 | ~10 | 200 | 31 | 120 | 6.5 | 200 | 50 | 100 | 4 |
| 21 | ~1 | 200 | 25 | 120 | 8 | 200 | 50 | 100 | 4 |
| 22 | ~1 | 270 | 33 | 33 | 8.2 | 270 | 68 | 68 | 4 |
| 23 | ~1 | 265 | 33 | 33 | 8 | 265 | 66 | 66 | 4 |

| | Evaluation based on percentage variation of the electrical resistance * | | | | | | | |
|---|---|---|---|---|---|---|---|---|
| Examples | 250 cycles | 500 cycles | 750 cycles | 1000 cycles | 1250 cycles | 1500 cycles | 2000 cycles | 2500 cycles |

TABLE 1-continued

| | | | | | | | | |
|---|---|---|---|---|---|---|---|---|
| 1 | ○ | X | X | X(23.3) | X | X | X | X |
| 2 | ◎ | ◎ | ◎ | ○(8.7) | X | X | X | X |
| 3 | ◎ | ◎ | ◎ | ◎(4.7) | ○ | X | X(47.1) | X |
| 4 | ◎ | ◎ | ◎ | ◎(4.3) | ◎ | ○ | X | X |
| 5 | ◎ | ○ | X | X(15.5) | X | X | X | X |
| 6 | ◎ | ◎ | ◎ | ◎(4.3) | ○ | X | X(121) | X |
| 7 | ◎ | ◎ | ◎ | ◎(2.3) | ◎ | ◎ | ○(8.7) | X |
| 8 | ◎ | ◎ | ◎ | ◎(2.2) | ◎ | ◎ | ◎(3.8) | ○ |
| 9 | ◎ | ◎ | ◎ | ◎(4.5) | ◎ | ○ | X(43.8) | X |
| 10 | ◎ | ◎ | ◎ | ◎(2.6) | ◎ | ◎ | ○(8.5) | X |
| 11 | ◎ | ○ | X | X | X | X | X | X |
| 12 | ◎ | ◎ | ○ | X | X | X | X | X |
| 13 | ○ | ○ | X | X(17.6) | X | X | X | X |
| 14 | ◎ | ◎ | ◎ | ◎(4.3) | ○ | X | X | X |
| 15 | ◎ | ◎ | ◎ | ◎(2.1) | ◎ | ◎ | ○ | ○ |
| 16 | ◎ | ◎ | ◎ | ◎(1.9) | ◎ | ◎ | ◎ | ○ |
| 17 | ◎ | ◎ | ○ | X(12.3) | X | X | X | X |
| 18 | ◎ | ◎ | ◎ | ◎(2.6) | ◎ | ◎ | X | X |
| 19 | ◎ | ◎ | ◎ | ◎(1.0) | ◎ | ◎ | ◎ | ○ |
| 20 | ◎ | ◎ | ◎ | ◎(0.8) | ◎ | ◎ | ◎ | ◎ |
| 21 | X | X | X | X | X | X | X | X |
| 22 | ◎ | ○ | ○ | X(29.3) | X | X | X | X |
| 23 | ◎ | ◎ | ◎ | ○ | X | X | X | X |

* ◎ excellent (within 5%), ○ good (5 to 10%), X poor (not les than 10%) The numerical value within ( ) is the electrical resistance variation percentage (%)

As is clear from the Table 1, a "good" or better evaluation result was obtained up to the 1000th cycle for all examples having the condition that the aspect ratio Rasp is not less than 4 and the minimum diameter exceeds 30 µm with both the external conductor posts and the internal conductor posts and that the aspect ratio Rasp of the external conductor posts is greater than or equal to the aspect ratio Rasp of the internal conductor posts (Examples 2 to 4, 6 to 10, 14 to 16, 18 to 20, and 23). On the other hand, a "poor" evaluation was obtained at some stage before the 1000th cycle for examples that do not match the above condition (Examples 1, 5, 11 to 13, 17, and 21). With respect to Example 22, wherein the aspect ratio of the external conductor posts exceeded 2 times the aspect ratio of the internal conductor posts, "good" evaluations were obtained up to the 750th cycle and "poor" evaluations were obtained from the 1000th cycle onwards. With respect to Example 23, wherein the aspect ratio of the external conductor posts exceeded 2 times the aspect ratio of the internal conductor posts, "good" evaluations were obtained up to the 1000th cycle and "poor" evaluations were obtained from the 1250th cycle onwards. The numerical values in the parenthesis indicate the resistance variation percentages.

When Example 2 is compared with Examples 3 and 4, "good" evaluations were obtained up to a higher number of cycles with the Examples 3 and 4, wherein the aspect ratio Rasp of the external conductor posts was 1.25 times or more the aspect ratio Rasp of the internal conductor posts, than with the Example 2, wherein the aspect ratio Rasp of the external conductor posts is equal to the aspect ratio Rasp of the internal conductor posts. The same can be said with a comparison of Example 6 with Examples 7 and 8, a comparison of Example 14 with Examples 15 and 16, and a comparison of Example 18 with Examples 19 and 20.

Furthermore, when Example 2 is compared with Example 14, while both of the examples have the external conductor posts that are positioned only at the single outermost array in both of these, "good" evaluations were obtained up to a higher number of cycles with the Example 14 having the conductor posts with constrictions, than with the Example 2 having the conductor posts of straight shapes. The same can be said with a comparison of Example 3 with Example 15 and a comparison of Example 4 with Example 16. The same can also be said with a comparison of Example 6 with Example 18, a comparison of Example 7 with Example 19, and a comparison of Example 8 with Example 20, with each of which the external conductor posts are positioned from the outermost array to the tenth array.

Yet furthermore, when Examples 3, 7, 9, and 10 are compared, while all these examples have the aspect ratio Rasp of the external conductor posts of 5 and the Rasp of the internal conductor posts of 4, "good" or "excellent" evaluations tended to be obtained up to a higher number of cycles with in the order of Example 3, wherein the external conductor posts are positioned only at the single outermost array, Example 9, wherein the external conductor posts are positioned from the outermost array to the third array, Example 10, wherein the external conductor posts are positioned from the outermost array to the sixth array, and Example 7, wherein the external conductor posts are positioned from the outermost array to the tenth array.

Figure 9:
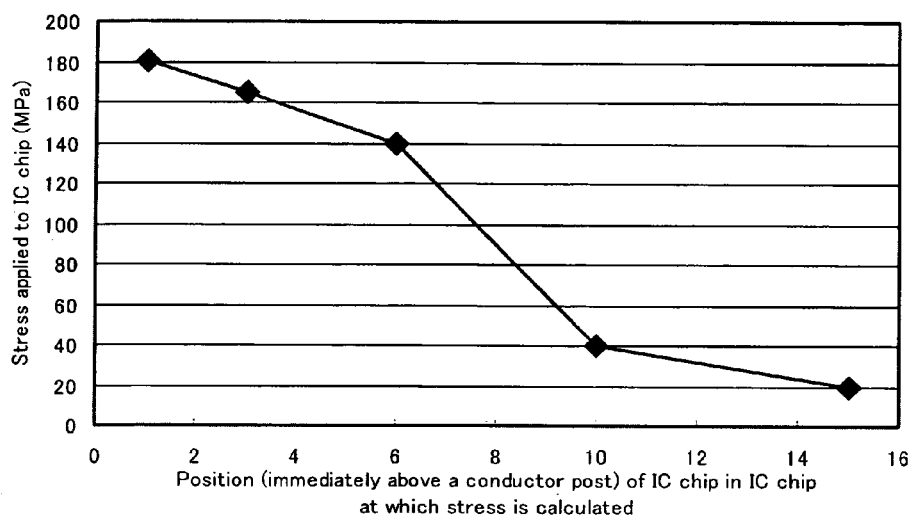
FIG. 9 shows a table and a graph of the relationship between positions in an IC chip and the stress applied to those positions.
Figure 9:
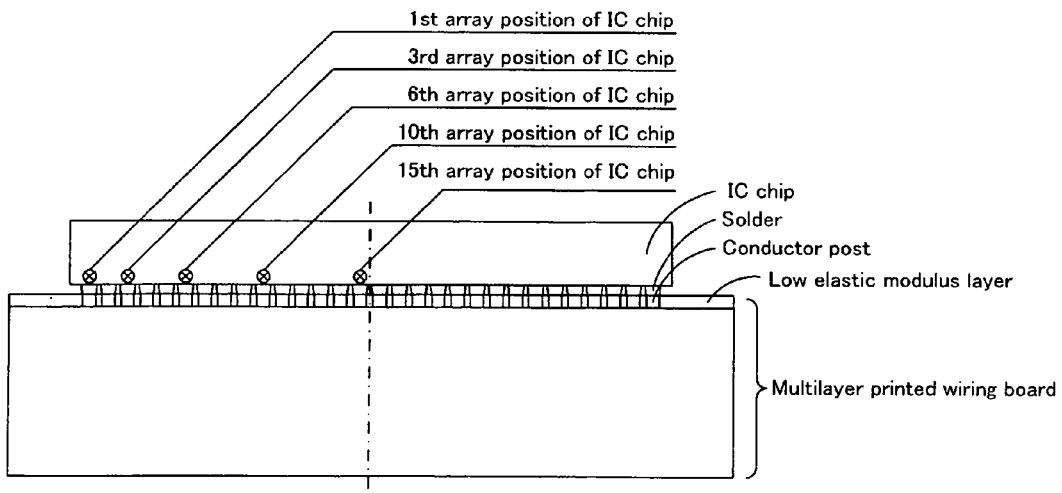

The relationship between positions in the IC chip and the stress applied to those positions shall now be described. A 3D strip simulation was performed for an IC mounted substrate, wherein an IC chip, having interlayer insulating films that have been made porous, is mounted to a multilayer printed wiring board. And the relationship between positions of the connection portions of the IC chip and the stress applied to these positions was calculated, where the positions of the connection portion of the IC chip, that is the array numbers of the connection portions of the IC chip, are formed from the outermost array to the fifteen array so as to be in a one-to-one correspondence with the conductor posts of the multilayer printed wiring board. The aspect ratio of all conductor posts was set to the same value of 1 and the material qualities of the low elastic modulus layer, conductor posts, IC chip, multilayer printed wiring board, solder, etc., were deemed to be the same for all cases. The thickness and other dimensions of these components were also deemed to be the same in all cases, and calculations were performed upon inputting the Young's moduli, Poisson's ratios, and thermal expansion coefficients. The results are shown in the table and graph of FIG. 9. As is clear from the table and graph, a comparatively large stress is applied to connection portions of the IC chip of the outermost array to the tenth array (total number of arrays ×2/3) and an especially large stress is applied to the outermost array to the sixth array (total number of arrays ×2/5). Consequently, since the need to relax stress at conductor posts at positions beyond the (total number of arrays ×2/3)-th array (conductor posts at the inner side of the 2/3-th array) is low, the external conductor posts are preferably set within the range from the outermost array to the (total number of arrays ×2/3)-th array and the external conductor posts are especially preferably set within the range from the outermost array to the (total number of arrays ×2/5)-th array.

The present invention claims priority to Japanese Patent Application No. 2004-134370, filed on Apr. 28, 2004, contents of which are incorporated herein by reference in their entirety.

What is claimed is:

1. A multilayer printed wiring board comprising:
   a core substrate;
   a build-up layer that is formed on the core substrate and has a conductor pattern disposed on an upper surface;
   a low elastic modulus layer that is formed on the build-up layer;
   mounting electrodes that are disposed on the upper surface of the low elastic modulus layer and connected via connecting portions to an electronic element; and
   conductor posts that pass through the low elastic modulus layer and electrically connect the mounting electrodes with the conductor pattern; and
   wherein the conductor posts have the aspect ratio Rasp of not less than 4 and the diameter exceeding 30 μm, and the aspect ratio Rasp of external conductor posts which, among the conductor posts, are positioned at external portions of the low elastic modulus layer is greater than or equal to the aspect ratio Rasp of internal conductor posts which are positioned at internal portions of the low elastic modulus layer.

2. The multilayer printed wiring board according to claim 1, wherein, among the conductor posts, the aspect ratio Rasp of the external conductor posts is not less than 1.25 times and not more than 2 times the aspect ratio Rasp of the internal conductor posts.

3. The multilayer printed wiring board according to claim 1, wherein, among the conductor posts, at least the external conductor posts are formed to have a shape with a constriction.

4. The multilayer printed wiring board according to claim 1, wherein the low elastic modulus layer is formed so as to be substantially matched with the entirety of a virtual projection of the electronic element onto the low elastic modulus layer.

5. The multilayer printed wiring board according to claim 1, wherein the electronic element includes an IC chip having interlayer insulating films that have been made porous.

6. The multilayer printed wiring board according to claim 2, wherein the electronic element includes an IC chip having interlayer insulating films that have been made porous.

7. The multilayer printed wiring board according to claim 2, wherein, among the conductor posts, at least the external conductor posts are formed to have a shape with a constriction.

8. The multilayer printed wiring board according to claim 2, wherein the low elastic modulus layer is formed so as to be substantially matched with the entirety of a virtual projection of the electronic element onto the low elastic modulus layer.

9. The multilayer printed wiring board according to claim 3, wherein the maximum diameter/minimum diameter of the external conductor posts that are formed to have a shape with a constriction is not less than 2 and not more than 4.

10. The multilayer printed wiring board according to claim 1, wherein the mounting electrodes are top surfaces of the conductor posts that have been formed to be substantially coplanar with the upper surface of the low elastic modulus layer.

11. The multilayer printed wiring board according to claim 7, wherein the maximum diameter/minimum diameter of the external conductor posts that are formed to have a shape with a constriction is not less than 2 and not more than 4.

12. The multilayer printed wiring board according to claim 2, wherein the mounting electrodes are top surfaces of the conductor posts that have been formed to be substantially coplanar with the upper surface of the low elastic modulus layer.

13. The multilayer printed wiring board according to claim 1, wherein when the conductor posts are formed to have multiple arrays from an outermost array to an N-th array, the conductor posts within a range from the outermost array to the (N×2/3)-th array are set to the external conductor posts.

14. The multilayer printed wiring board according to claim 1, wherein the Young's modulus at 30° C. of the low elastic modulus layer is 10 MPa to 1 GPa.

15. The multilayer printed wiring board according to claim 2, wherein when the conductor posts are formed to have multiple arrays from an outermost array to an N-th array, the conductor posts within a range from the outermost array to the (N×2/3)-th array are set to the external conductor posts.

16. The multilayer printed wiring board according to claim 2, wherein the Young's modulus at 30° C. of the low elastic modulus layer is 10 MPa to 1 GPa.

* * * * *